(12) United States Patent
Takemura (10) Patent No.: US 8,021,960 B2
(45) Date of Patent: Sep. 20, 2011

(54) METHOD FOR MANUFACTURING SEMICONDUCTOR DEVICE

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/897,045

(22) Filed: Oct. 4, 2010

(65) Prior Publication Data

US 2011/0081769 A1 Apr. 7, 2011

(30) Foreign Application Priority Data

Oct. 6, 2009 (JP) ................................ 2009-232236

(51) Int. Cl.
*H01L 21/30* (2006.01)
(52) U.S. Cl. . 438/455; 438/456; 438/458; 257/E21.568; 257/E21.57
(58) Field of Classification Search ................ 438/455, 438/456, 458; 257/E21.568, E21.57
See application file for complete search history.

(56) References Cited

U.S. PATENT DOCUMENTS

| 5,374,564 A | 12/1994 | Bruel |
| 5,757,456 A | 5/1998 | Yamazaki et al. |
| 7,119,365 B2 | 10/2006 | Takafuji et al. |
| 2003/0032210 A1 | 2/2003 | Takayama et al. |
| 2009/0023243 A1 | 1/2009 | Koyanagi |
| 2009/0117704 A1* | 5/2009 | Yamazaki et al. ............ 438/406 |

* cited by examiner

*Primary Examiner* — Hsien-ming Lee
(74) *Attorney, Agent, or Firm* — Nixon Peabody LLP; Jeffrey L. Costellia (57) ABSTRACT

A chip provided with a layer for separation of a surface region and a hydrophilic surface is manufactured. One or both of a hydrophilic region and a hydrophobic region are formed on a substrate surface where the chip is placed. Liquid is dropped onto the hydrophilic region on the substrate surface, and the chip is placed thereon. The substrate and the chip are heated while being pressure-bonded so that the chip is fixed on the substrate surface, and then the surface region of the chip is separated. By providing a liquid layer in a position where the chip is placed, the chip can be placed on the substrate with high accuracy and thus productivity can be increased.

16 Claims, 9 Drawing Sheets

Peripheral Circuit TFT | Pixel TFT

METHOD FOR MANUFACTURING SEMICONDUCTOR DEVICE

BACKGROUND OF THE INVENTION

1. Field of the Invention

An embodiment of the present invention relates to a technique for selectively forming a semiconductor layer over a substrate, or a technique for selectively forming an integrated circuit, an active element, a passive element, or the like which is formed by using the semiconductor layer, over a substrate.

2. Description of the Related Art

In today's electronics industry, a technique for attaching or mounting an integrated circuit, an active element, a passive element, or the like, or a substrate chip (hereinafter referred to as a chip) including any of these or a device (a package) in which the chip is sealed in plastic, ceramics, or the like on a substrate is essential. Hereinafter, a "chip" in this specification is not limited in size, thickness, and shape, unless otherwise specified. This technique is needed, for example, when an LSI chip or an LSI package used for driving an active matrix circuit is attached on a glass substrate provided with the active matrix circuit. For example, COG and TAB are known as a technique for attaching an LSI chip and a technique for attaching an LSI package, respectively.

However, when an LSI chip or an LSI package is attached on a substrate with such a technique, the thickness is increased in a portion where the attachment is performed. As a method for solving this problem, there is a technique in which a chip or the like is attached on a substrate and then separation is performed so that only a surface portion where a circuit is formed is left on the substrate, whereby the thickness is reduced, as disclosed in Patent Document 1 (see Patent Document 1).

The following technique is also disclosed. A surface of a region of a substrate, where a chip or the like is to be placed, is made hydrophilic and a surface of the other region is made hydrophobic. Further, a surface of the chip or the like, which is to be in contact with the substrate, is also made hydrophilic. A proper quantity of liquid is dropped onto the hydrophilic region of the substrate, and then the chip or the like is roughly dropped to the portion where it is to be placed. Consequently, the position of the chip or the like is precisely aligned in a self-aligned manner by surface tension of the liquid (see Patent Document 2 as an example).

REFERENCE

[Patent Document 1] U.S. Pat. No. 5,757,456
[Patent Document 2] United States Published Patent Application No. 2009/0023243
[Patent Document 3] United States Published Patent Application No. 2003/0032210
[Patent Document 4] U.S. Pat. No. 5,374,564

SUMMARY OF THE INVENTION

Conventionally, an LSI chip or an LSI package has been mounted on a substrate by a method called pick and place. That is, a component to be attached (such as a chip or a package) is picked up and placed on a substrate. This step is automated and performed by a robot; however, that technique has a problem in that it is difficult to precisely control the position of the component to be placed on the substrate. That step is mechanically performed; thus, in order to precisely control the position, the step needs to be performed very slowly at the final stage in which the component is placed on the substrate. As a result, this step takes a long time.

Further, an effective method as a method for strongly attaching a component on a substrate has not been proposed.

Furthermore, a technique which utilizes a structural feature of a semiconductor device manufactured by such a method to improve the characteristics of the semiconductor device, and a semiconductor device which is obtained using such a technique have not been proposed.

The present invention is made to solve one or more of these problems.

One embodiment of the present invention solves any of the above problems by employing a manufacturing process including steps below. The present invention focuses especially on the fact that thermocompression bonding of a chip or the like and a substrate can be efficiently performed after the chip or the like is placed thereon with the use of liquid including pure water or liquid including water at 50 mol % or more as liquid dropped onto a hydrophilic region. The above liquid includes water at 50 mol % or more as described above, and may include alcohol having a boiling point of 100° C. or lower, such as ethyl alcohol, methyl alcohol, or isopropyl alcohol; hydrogen fluoride; hydrogen peroxide; ammonia; or the like as another component.

A preferred embodiment of the present invention includes the following steps:

(A) a step of manufacturing a chip in which a layer for separation of a surface region is formed and which has a hydrophilic surface;

(B) a step of forming one or both of a hydrophilic region and a hydrophobic region on a surface of a substrate, where the chip is placed;

(C) a step of dropping liquid including water at 50 mol % or more (preferably 90 mol %) onto the hydrophilic region;

(D) a step of placing the chip on the hydrophilic region;

(F) a step of heating the substrate and the chip while pressure-bonding is performed; and (G) a step of separating the surface region of the chip.

In these steps, the steps (A) and (B) and the steps (F) and (G) may be each exchanged or performed at the same time. Further, after the step of (D), a step (E) of evaporating the liquid is preferably added. This is because adhesion between the substrate and the chip is insufficient immediately after the step of (D) and thus they might be misaligned when even a slight force from the outside is applied thereto.

In evaporating the liquid, vaporization can be accelerated when a proper quantity of alcohol having a boiling point of 100° C. or lower, such as ethyl alcohol, methyl alcohol, or isopropyl alcohol, is added to the liquid. This is because such alcohol vaporizes together with water molecules.

Moreover, when one or both of the surface of the substrate and the surface of the chip are covered with a silicon oxide film, adhesion is further improved in the pressure-bonding step performed later. Here, the silicon oxide film is not limited to the one expressed by a chemical formula $SiO_2$. The silicon oxide film may include silicon at greater than or equal to 20 mol % and less than or equal to 50 mol % (preferably greater than or equal to 30 mol % and less than or equal to 40 mol %) and oxygen at greater than or equal to 50 mol % and less than or equal to 80 mol % (preferably greater than or equal to 60 mol % and less than or equal to 70 mol %), and may include nitrogen, carbon, aluminum, boron, phosphorus, or the like in addition to oxygen and silicon.

A method for forming such a silicon oxide film is limited depending on heat resistance of the substrate or the chip. For example, when the chip is formed using single crystal silicon, which is heat resistant, the silicon oxide film may be formed by dry or wet thermal oxidation. In the case where glass with low heat resistance or the like is used for the substrate, the silicon oxide film may be formed by a chemical vapor deposition (CVD) method, and organosilane is preferable as a source gas at the formation to silane ($SiH_4$) or disilane ($Si_2H_6$), which is generally used.

In the case where silicon is used for the surface of the substrate or the chip, a native oxide film may be formed on the surface of the silicon film by a known cleaning method such as so-called RCA cleaning, or a silicon oxide film may be formed by a method such as plasma oxidation. It is particularly preferable that the surfaces of the substrate and the chip be planarized by a chemical mechanical polishing (CMP) method or the like in view of improving adhesion.

In the formation of the silicon oxide film, the thickness thereof is not particularly limited but is preferably determined in consideration of coverage. In general, a silicon oxide film formed by thermal oxidation can be sufficiently uniform even if the thickness thereof is as extremely small as 1 nm; a silicon oxide film formed by a CVD method might include a pin hole or the like if the thickness thereof is too small and thus needs to have an adequate thickness.

In general, a surface provided with such a silicon oxide film or a surface polished by a CMP method has a hydrophilic property.

In the present invention, since both the substrate and the chip have a hydrophilic property, bonding with water in the liquid dropped in the step of (C) therebetween is promoted. Further, although most water in the liquid is vaporized by heating step, a small quantity of water remaining between such silicon oxide films helps bonding of the silicon oxide films by a chemical catalytic reaction of water molecules at a high temperature, whereby higher adhesion is obtained.

When the liquid used in the step of (C) includes hydrogen fluoride at a proper quantity (10 mol % or less, preferably 2 mol % or less), the surface of the silicon oxide film is activated by etching its outermost surface, which is effective in improving adhesion.

A similar effect can also be obtained by addition of ammonia and hydrogen peroxide to the liquid. Also in this case, the surface of the silicon oxide film is activated by removal of an organic substance on the surface.

In order to form a hydrophobic region on the substrate, for example, a method in which a silicon oxide film is processed with fluorine plasma or the like; a method by which a film including a hydrophobic material such as graphite, diamond-like carbon, silicon (amorphous silicon, in particular), or a variety of polymers, or a film including a mixture of two or more of these materials is formed; or the like may be employed.

Here, a graphite film may include carbon at 60 mol % or more (preferably 90 mol % or more) and include SP2 bonds, which are seen in graphite, at greater than or equal to 80% (preferably greater than or equal to 90%) of carbon bonds. The graphite film may include oxygen, silicon, nitrogen, aluminum, boron, phosphorus, or the like in addition to carbon.

A diamond-like carbon film may include carbon at 60 mol % or more (preferably 90 mol % or more) and include SP3 bonds, which are seen in diamond-like carbon, at greater than or equal to 80% (preferably greater than or equal to 90%) of carbon bonds. The diamond-like carbon film may include oxygen, silicon, nitrogen, aluminum, boron, phosphorus, or the like in addition to carbon.

In the case where a silicon film is formed by a CVD method, it is preferable to use a source gas including fluorine such as silicon tetrafluoride ($SiF_4$) so that the amount of fluorine in the film is increased. Alternatively, the silicon film may be formed by a reactive sputtering method in which silicon tetrafluoride or the like is introduced in an atmosphere, which is one of sputtering methods.

Polymers include hydrogen carbide as a main component and thus have a hydrophobic property in general; in particular, a polymer including fluorine, a polymer having a benzene group, a polymer in which part of carbon is substituted by silicon, and the like have an excellent hydrophobic property.

In order to perform the above step of (B), for example, a hydrophobic film or a hydrophobic surface may be formed by a method like the above and then a silicon oxide film may be selectively formed. For example, after the above hydrophobic film is formed, a silicon oxide film is formed by a CVD method or the like. After that, the silicon oxide film is etched by a known photolithography method. Thus, a hydrophobic region and a hydrophilic region can be selectively formed.

Alternatively, if such a high accuracy is not required, the following method may be employed: a precursor of silicon oxide that is dissolved in ink is selectively formed on a substrate by a method such as an inkjet method, in which drawing is performed directly on the substrate with the use of a droplet, and then baking is performed thereon. In this case, a property of the precursor or the ink needs to be considered. Since the surface of the substrate is hydrophobic, water-soluble ink should not be used. This is because the ink is shed by the hydrophobic surface, resulting in failure in proper drawing. Therefore, it is preferable that oil-based ink or the like be used and a material which is soluble in the ink be used for the precursor.

In an opposite manner, it is possible to provide a hydrophilic surface on the substrate first and then form a hydrophobic film selectively. In this case, however, the thickness of the hydrophobic film needs to be considered. When the hydrophobic film is too thick, a step is formed between a hydrophobic region and a hydrophilic region and the chip is put in the depression. If the quantity of the liquid dropped in the step of (C) is small for the depression, the chip cannot be lifted higher than the step by surface tension, and the chip cannot be provided in a desired position. Therefore, the quantity of the liquid needs to be set in consideration of the step and preferably accounts greater than or equal to 80% of the volume of the depression due to the step (that is, the height of the step×the area of the chip). Further, the height of the step is preferably less than or equal to 10%, preferably less than or equal to 1%, of a length n of one side of the chip.

In addition to the above limitation, the quantity of the liquid in the step of (C) may be greater than or equal to 0.1% and less than or equal to 20%, preferably greater than or equal to 0.5% and less than or equal to 5%, of the volume of the chip. When the quantity of the liquid is too large, instability in placement of the chip on the substrate is increased; when the quantity of the liquid is too small, the chip cannot be provided in a desired position of the substrate.

As for the step of (B), part of the hydrophilic film or the hydrophobic film may be modified so as to have a property opposite to its original property. In other words, treatment for changing a hydrophobic film to a hydrophilic film or changing a hydrophilic film to a hydrophobic film may be performed. For example, after a hydrophobic amorphous silicon film is formed on a substrate, part thereof is selectively subjected to plasma oxidation treatment, whereby an extremely thin (0.1 nm to 10 nm, typically 1 nm) silicon oxide film having a hydrophilic property can be formed in this part.

In the step of (A), as a layer for separation of the surface region, a film like a metal film including a material such as tungsten, which is disclosed in Patent Document 3, or a layer into which ions of hydrogen or the like are implanted, which is disclosed in Patent Document 4, can be used. Alternatively, a film of amorphous silicon or another material which includes excessive hydrogen can be used.

The temperature of heat treatment in the step of (F) is set depending on the above layer for separation of the surface region. In this heat treatment, in general, the higher the temperature is, the higher adhesion is obtained. For example, in the case of using a material with high heat resistance, such as tungsten, treatment at 1000° C. or higher can be performed.

In the case where a layer into which hydrogen ions are implanted or a layer of amorphous silicon including excessive hydrogen is used as the layer for separation of the surface region, separation of the surface due to desorption of hydrogen begins in the temperature range of 300° C. to 600° C. In general, since high adhesion is not obtained at 300° C. or lower, treatment at a higher temperature is needed; however, in the case where separation of the surface is also caused by this heat treatment, it is preferable that the temperature be kept for a relatively long time (2 hours to 48 hours) at approximately a temperature at which separation is caused and then be raised to an adequate temperature at which desired adhesion is obtained.

Alternatively, in the case where the substrate or the chip transmits light with a specific wavelength and the layer into which ions of hydrogen or the like are implanted or the film of amorphous silicon including excessive hydrogen is used as the layer for separation of the surface region, the surface region can be separated by irradiation with high-energy light such as laser light through the transparent substrate or chip.

In this case, light passing through the substrate or the chip needs to be absorbed in the layer for separation of the surface region. As an example, the case of using a chip formed in such a manner that an amorphous silicon film including excessive hydrogen (a first silicon film) like the above is formed over a glass substrate and then a silicon oxide film and an amorphous silicon film (a second silicon film) are stacked thereover is given. When the second harmonic (532 nm) of an Nd:YAG laser is delivered through a back surface of the chip, glass transmits this laser light while silicon absorbs this light. Therefore, during heating of the first silicon film, hydrogen is discharged; accordingly, the silicon oxide film and the second silicon film in the upper layer are separated from the chip. After that, heat treatment for obtaining adhesion may be performed.

In an embodiment of the present invention, a semiconductor layer can have any of a single crystal, polycrystalline, or amorphous state; however, it is particularly effective to form a single crystal semiconductor layer, which is difficult to form over a substrate by a vapor phase technique. In an embodiment of the present invention, a substrate refers to a printed substrate; a substrate including a transparent material such as glass or plastic; a substrate including a semiconductor material, such as a silicon wafer or a compound semiconductor wafer; a substrate formed using a material such as metal, an alloy material, or ceramics; or the like. The shape like a plate shape or a spherical shape, the size, the thickness, and the material of the substrate may be any unless otherwise specified. Further, a surface on which the above integrated circuit, active element, passive element, or the like is attached or mounted may be provided with a proper film, as needed. Furthermore, a substrate provided with another substrate or a chip may also be regarded as a substrate.

Note that in this specification, the ordinal number such as "first", "second", or "third" is given for convenience to distinguish elements, and not given to limit the number, the arrangement, and the order of the steps unless otherwise specified.

Note that when a component is "over" or "under" another component, the former component may be directly formed on the latter component, or still another component may be provided therebetween.

In this specification, terms in a singular form which are used for description of the embodiments include a concept of plural, unless it is contextually clear that a singular form or a plural form is intentionally used. Note also that terms such as "include" and "have" indicate the existence of a feature, a number, a step, an operation, a component, a member, or a combination of any of these, which is described in this specification, and do not exclude a possibility that one or more other features, numbers, steps, operations, components, members, combinations of any of these, or the like may exist or be added.

By manufacturing a semiconductor device in accordance with the above-described method, a component can be efficiently provided over a substrate with high accuracy and productivity can be increased. According to the present invention, in particular, a significant effect can be obtained by using liquid including water for an attachment surface of the component, especially when the bonding is performed between silicon oxide and silicon oxide, as described above. A method for manufacturing a semiconductor device or a semiconductor device described in the embodiments below can solve one or more of the above problems.

DETAILED DESCRIPTION OF THE INVENTION

Embodiments will be described below for specific explanation of the present invention. Needless to say, the present invention is not limited to the embodiments. The present invention is not limited to the description below, and it is easily understood by those skilled in the art that the modes and details can be modified in various ways. Therefore, the present invention is not construed as being limited to description of the embodiments below.

Embodiment 1

In this embodiment, a method for manufacturing a thin film transistor (TFT) including single crystal silicon over a glass substrate in accordance with the present invention will be schematically described. Although details of methods and conditions for film formation, etching, and the like will not be described below beyond necessity, known techniques, conditions, and the like may be employed. In this embodiment, as illustrated in FIG. 3A, an example will be described in which peripheral circuits 32a to 32j are formed using a single crystal silicon film in a liquid crystal display device that includes an active matrix circuit 33 formed using amorphous silicon over a glass substrate 31. The single crystal silicon film included in the peripheral circuits 32a to 32j is formed in such a manner that a single crystal silicon wafer 21 is divided and the resulting wafers are attached to respective portions, as illustrated in FIG. 3B. Description is made below with reference to FIGS. 1A to 1E, FIGS. 2A and 2B, and FIGS. 4A to 4D.

First, a silicon oxide film 12 is formed to a thickness of 100 nm to 2000 nm, for example 500 nm, over a glass substrate 11. A barrier film may be formed using silicon nitride or the like between the silicon oxide film 12 and the glass substrate 11 in order to prevent entry of a mobile ion (of sodium or the like) or a heavy metal ion from the substrate (see FIG. 1A).

Figure 1A:
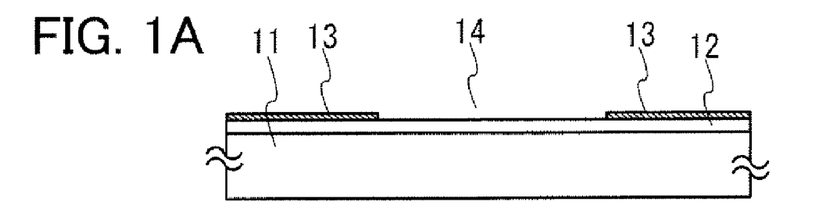
FIGS. 1A to 1E illustrate one method for manufacturing a semiconductor device, according to the present invention.

Next, a diamond-like carbon film 13 is formed to a thickness of 10 nm to 200 nm, for example 50 nm, over the silicon oxide film 12. In this step, the diamond-like carbon film 13 is preferably provided for a back surface and a side surface of the glass substrate 11 in addition to the front surface thereof. Then, part of the diamond-like carbon film 13 is removed by a method such as plasma oxidation, so that the silicon oxide film 12 is exposed. A region 14 where the silicon oxide film is exposed is a region to which single crystal silicon is attached in a subsequent step (FIG. 1A).

Figure 2A:
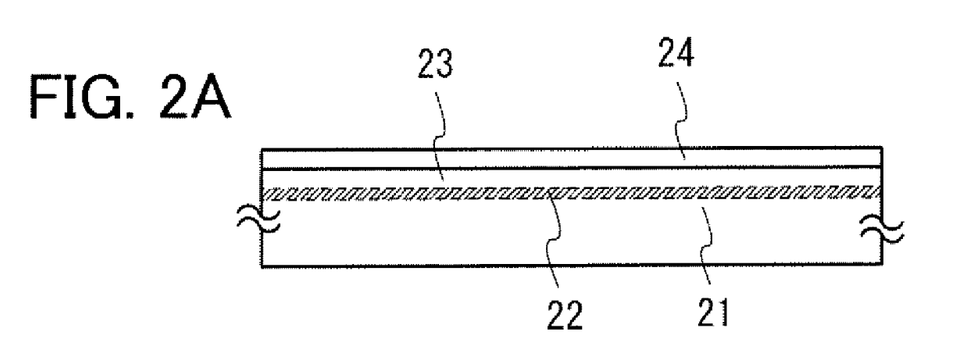
FIGS. 2A and 2B illustrate one method for manufacturing a semiconductor device, according to the present invention.
Figure 3A:
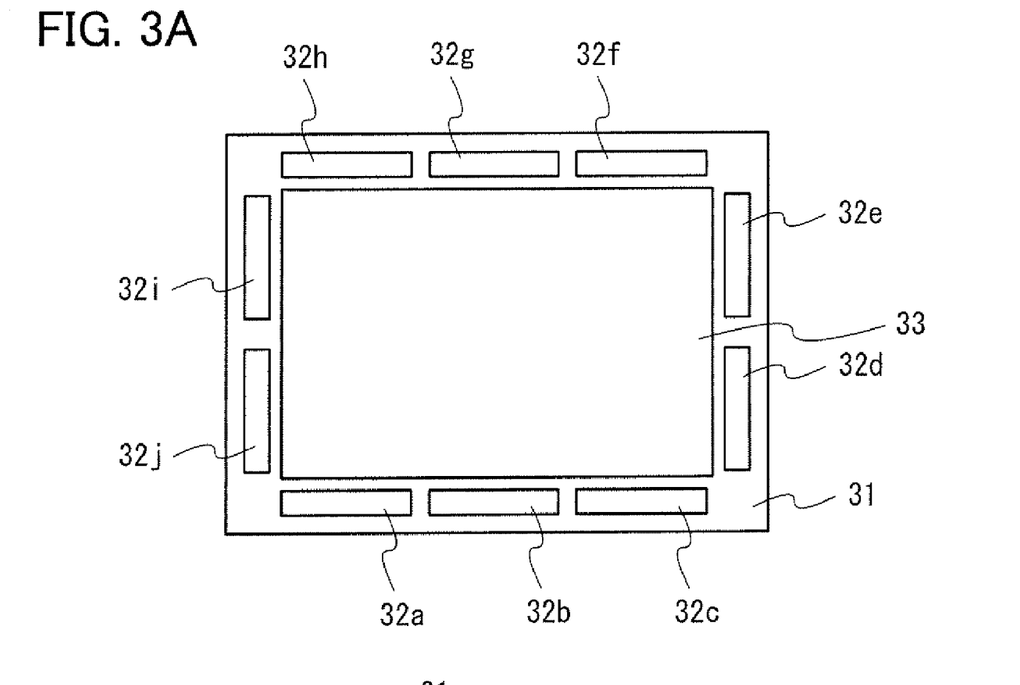
FIGS. 3A and 3B illustrate one example of a semiconductor device manufactured in accordance with the present invention.
Figure 3B:
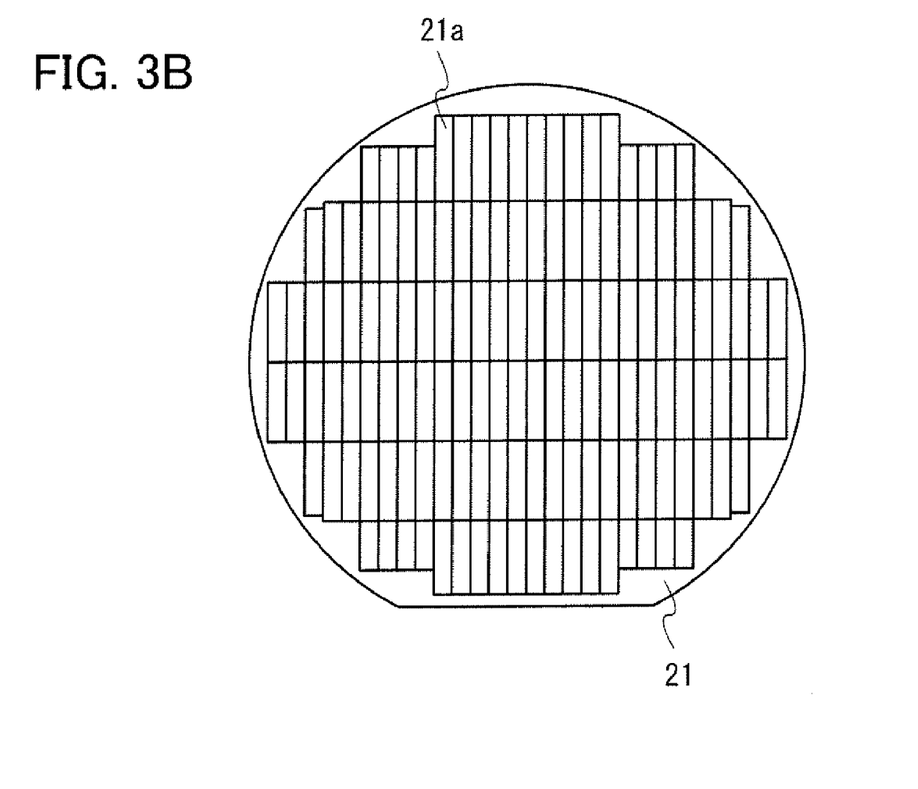

Meanwhile, a silicon oxide film 24 is formed to a thickness of 50 nm to 400 nm, preferably 100 nm to 200 nm, for example 100 nm, over the single crystal silicon wafer 21 as illustrated in FIG. 2A. Then, hydrogen ions are implanted into the wafer, so that a region 22 including much hydrogen is formed at a depth of 100 nm to 500 nm, for example mainly at a depth of 200 nm, from the surface. The depth at which hydrogen is implanted can be changed by changing acceleration energy; therefore, the acceleration energy (voltage) or ion species may be changed in accordance with a desired depth. As the ion species, not only the one including only hydrogen, such as $H^+$, $H_2^+$, or $H_3^+$, but also the one including another element in addition to hydrogen, such as $BH_2^+$, $CH_3^+$, or $HeH^+$, may be used. Note that it is generally known that a region including much hydrogen has a certain width, and the width also depends on the acceleration energy; therefore, this point is preferably taken into consideration.

In this manner, the region 22 including much hydrogen and a region 23 which is a surface portion thereof are formed in the single crystal silicon wafer 21 (FIG. 2A).

Figure 2B:
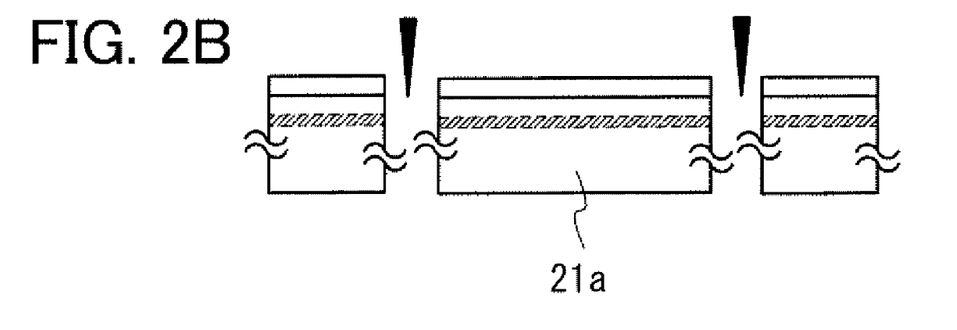

Next, the single crystal silicon wafer 21 is divided into chips with a desired size with the use of a known tool such as a dicing saw or a known technique. FIGS. 3A and 3B may be referred to for this step. At this time, when the size of the chip is 1% to 5% smaller than that of the region 14 where the silicon oxide film is exposed, the chip can be surely provided in the region 14 where the silicon oxide film is exposed in a subsequent step. In that case, however, the accuracy of alignment is lowered as the chip size is reduced. In this manner, a divided single crystal silicon wafer 21a is obtained (FIG. 2B).

Figure 1B:
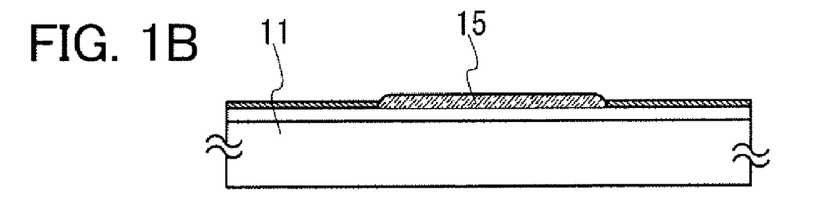

In the meantime, as illustrated in FIG. 1B, a proper quantity of liquid 15 including ultrapure water is dropped onto the region 14 where the silicon oxide film over the glass substrate 11 is exposed. The quantity of the liquid may be optimized in accordance with the area of the opening or the like. Instead of ultrapure water, water to which alcohol, hydrogen fluoride, or the like is added may be used. The surface of the region 14 where the silicon oxide film is exposed is hydrophilic, whereas the other region which is covered with the diamond-like carbon film 13 is hydrophobic; therefore, the liquid stays in the opening (FIG. 1B).

Figure 1C:
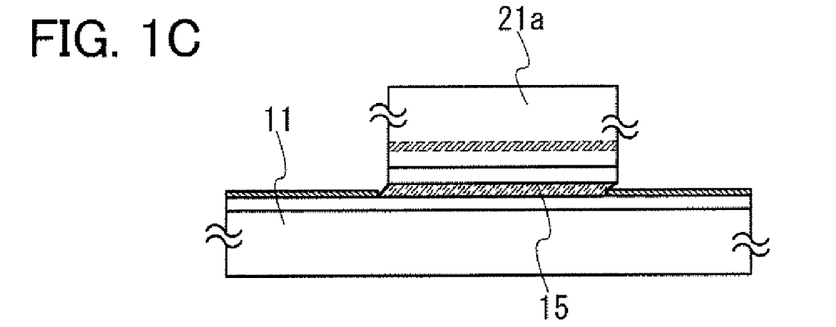
Figure 1D:
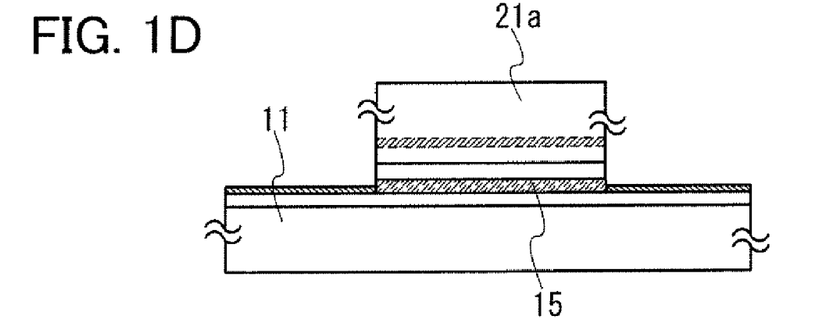

After that, the divided single crystal silicon wafer 21a is set above the glass substrate 11, and then dropped to the glass substrate 11 (FIG. 1C). At this time, the divided single crystal silicon wafer 21a is not necessarily dropped to the region 14 where the silicon oxide film is exposed with accuracy; even in the state of slight misalignment illustrated in FIG. 1C, the divided single crystal silicon wafer 21a is soon settled in a position that is substantially aligned with the opening, owing to surface tension of the liquid 15, as illustrated in FIG. 1D.

Figure 1E:
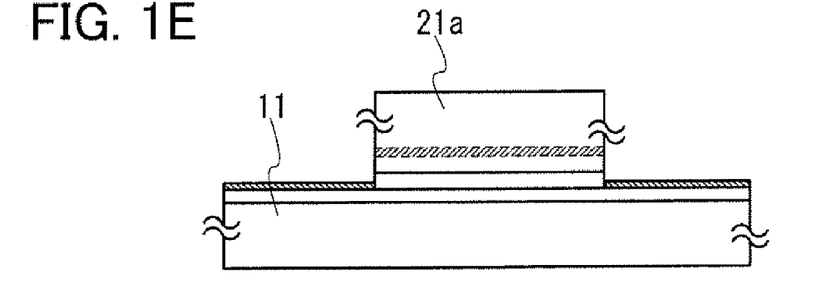

After that, the liquid is vaporized (FIG. 1E).

Figures 4A, 4B:
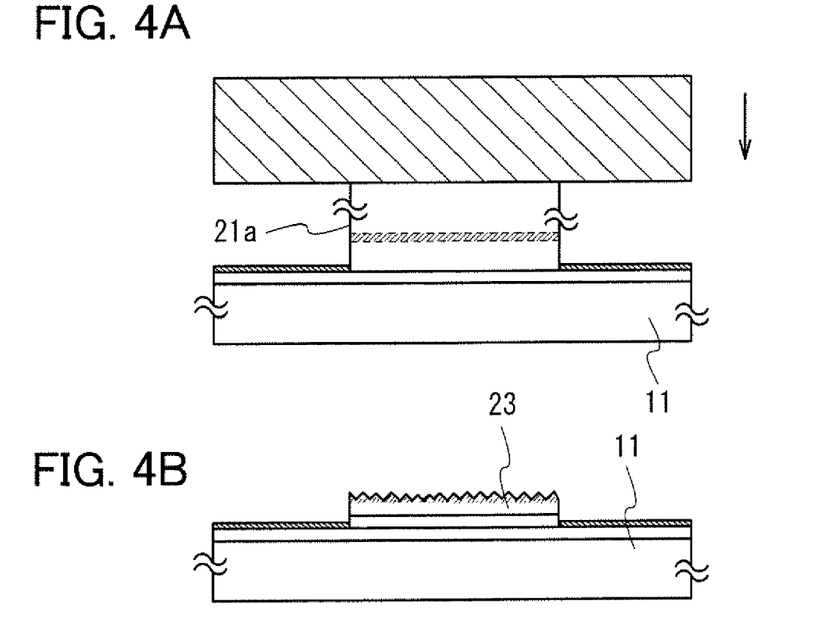
FIGS. 4A to 4D illustrate one method for manufacturing a semiconductor device, according to the present invention.

Next, the divided single crystal silicon wafer 21a is heated at 300° C. to 500° C. in the state of being mechanically pressure-bonded to the glass substrate 11 (FIG. 4A).

At this time, the holding time of the temperature, the temperature rising rate, and the like may be determined as appropriate. In general, the divided single crystal silicon wafer 21a is held at 300° C. for 2 hours to 24 hours, is then held at 430° C. for 2 hours to 24 hours, and after that, heated to 500° C., whereby the region 23 in the surface portion of the divided single crystal silicon wafer 21a is cleaved and separated. Note that these conditions may be changed depending on the depth of the region 22 including much hydrogen or existence of an element or the like implanted in addition to hydrogen.

When heat treatment is performed at a higher temperature after the separation, adhesion between the silicon oxide film 12 over the glass substrate 11 and the silicon oxide film on the surface region of the divided single crystal silicon wafer 21a is improved. Heat treatment for this purpose is preferably performed at 600° C. or higher. In general, sufficient adhesion can be obtained by heat treatment at approximately 1100° C.; however, in the case of using a glass substrate, treatment at such a high temperature cannot be performed. Therefore, it is preferable that treatment temperature be lower than or equal to a transition point of glass and as high as possible.

In this manner, the divided single crystal silicon wafer 21a can be separated mainly along the region 22 including much hydrogen; however, the separation surface is very rough in general as illustrated in FIG. 4B. This is because the region 22 including much hydrogen has a certain thickness and the above cleavage due to desorption of hydrogen by the heating can be caused from any part of the region 22 including much hydrogen. In order to reduce such roughness, for example, planarization can be performed by a chemical mechanical polishing (CMP) method; however, in the case where the size of the glass substrate 11 is beyond a certain size, planarization by the CMP method cannot be evenly performed.

In such a case, planarization can be performed by wet etching or dry etching using a chemical solution or a gas which makes a difference in the etching rate depending on the characteristics of silicon. This is for the following reason: the region 22 including much hydrogen includes many defects in silicon bonds which are caused by implantation of hydrogen and thus has a higher etching rate than normal single crystal silicon.

Alternatively, the difference in oxidation rate due to the difference in the number of defects may be utilized. For example, when plasma oxidation is performed in the state of FIG. 4B, the region 22 including much hydrogen is easily oxidized, whereas the region 23 in the surface portion, which is under the region 22 including much hydrogen and formed of single crystal including less defects, is less likely to be oxidized. When plasma oxidation and removal of an oxide film are repeated several times by utilizing such characteristics, the region 22 including much hydrogen is selectively removed.

Figure 4C:
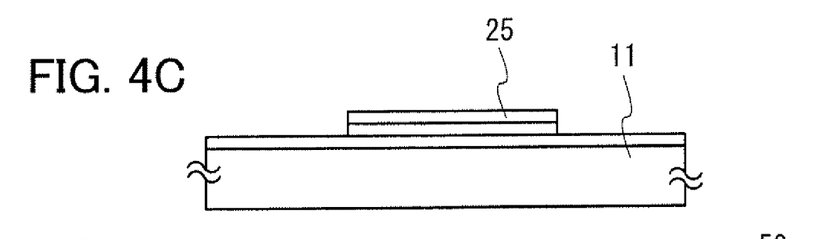

In the case of performing wet etching as such treatment, when not only the front surface of the glass substrate 11 but also the back surface and the side surface thereof are covered with diamond-like carbon, the glass substrate can be prevented from being eroded in the etching. In this manner, the region 22 including much hydrogen is completely removed. In this etching, since the region 23 in the surface portion, which is formed of single crystal silicon including less defects, is also partly etched in general, complete planarization is difficult. However, sufficient planarity can be obtained by additionally performing laser annealing or the like (FIG. 4C).

After that, the diamond-like carbon film 13 is oxidized and removed by a known method such as plasma oxidation or oxygen ashing. Through the above process, a single crystal silicon film 25 having a flat surface can be selectively formed over the glass substrate 11. After that, a semiconductor integrated circuit may be manufactured using the single crystal silicon film 25 by a known technique.

Figure 4D:
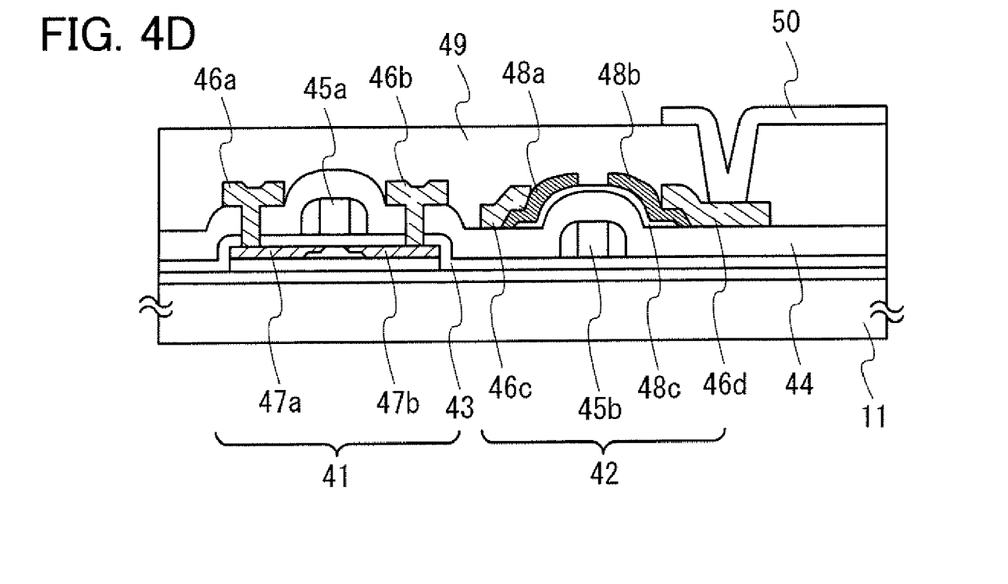

FIG. 4D illustrates the state where a TFT 41 using a single crystal silicon film and a TFT 42 using amorphous silicon are formed over the glass substrate 11. Although only two TFTs are illustrated, much more TFTs are actually formed. Further, the TFTs are adjacent to each other in the figure but not necessarily arranged in such a manner.

A method for manufacturing these TFTs and the like is briefly described below. A silicon oxide film 43 is formed to cover the silicon oxide film 12 and the single crystal silicon film 25 over the glass substrate 11. The silicon oxide film 43 serves as a gate insulating film of the TFT 41 using a single crystal silicon film, and may be formed to a suitable thickness by a suitable method. After that, a gate electrode 45a of the TFT 41, a gate electrode 45b of the TFT 42, and a gate wiring are formed using a first conductive film. A material of the first conductive film may be determined in consideration of a work function suitable for a gate electrode, heat resistance to heat treatment performed later, conductivity, and the like. The first conductive film is not limited to a single-layer film and may be a multi-layer film. In addition, the first conductive film may be formed using a material such as a semiconductor like silicon, metal, metal nitride, or metal silicide.

Further, sidewalls are formed on side surfaces of the gate electrodes 45a and 45b by a known anisotropic etching technique. The sidewalls are provided for formation of impurity regions 47a and 47b including an extension region in the single crystal silicon film 25, and have an effect of reducing a step of the gate electrode 45b of the TFT 42 so that the percentage of defective TFTs is lowered.

Then, an insulating layer 44 is formed using a material such as silicon nitride. The insulating layer 44 serves as an interlayer insulator in the TFT 41 and serves as a gate insulator in the TFT 42. Further, the insulating layer 44 can also be used to apply stress of tension or compression to a channel of the TFT 41. Therefore, the thickness, the film quality, and the like of the insulating layer 44 may be determined in accordance with characteristics needed for the TFTs.

An (intrinsic or i-type) amorphous silicon film 48c to which no impurity is added intentionally and $n^+$-type amorphous silicon films 48a and 48b are formed, and then a second wiring layer is formed using a material such as aluminum. The second wiring layer serves as source and drain electrodes 46a, 46b, 46c, and 46d of the TFTs 41 and 42. Further, after an insulating film 49 having planarity is formed, an electrode 50 which is formed using a transparent conductive material and connected to the TFT 42 is formed; thus, an integrated circuit is manufactured. The electrode 50 serves as a pixel electrode in an active matrix circuit, in the case of a liquid crystal display device for example. A pixel in a light-emitting device utilizing photoluminescence can also be formed using a similar electrode.

In the above example, the gate electrodes of the TFT 41 and the TFT 42 are formed using a wiring in the same layer but, needless to say, may be separately formed using wirings in different layers. In addition, the case where the interlayer insulator of the TFT 41 and the gate insulator of the TFT 42 are formed using the same insulating layer 44 is described; needless to say, the interlayer insulator and the gate insulator may be formed using different materials in different layers. Similarly, the source and drain electrodes 46a, 46b, 46c, and 46d of the TFT 41 and the TFT 42 are formed using the second wiring but may be formed using materials in different layers.

Embodiment 2

In this embodiment, a method for manufacturing a thin film transistor (TFT) including single crystal silicon and a TFT including polycrystalline silicon over a glass substrate in accordance with the present invention will be schematically described with reference to FIGS. 5A to 5E and FIGS. 6A and 6B.

Figure 5A:
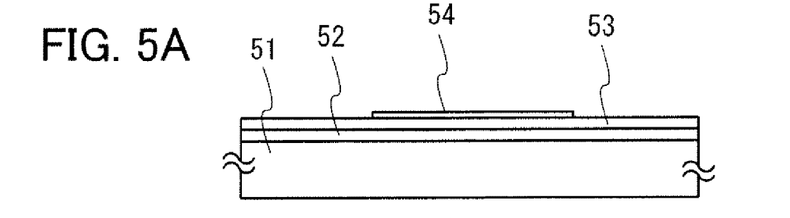
FIGS. 5A to 5E illustrate one method for manufacturing a semiconductor device, according to the present invention.

First, a silicon oxide film 52 is formed to a thickness of 100 nm to 2000 nm, for example 500 nm, over a glass substrate 51. As described in Embodiment 1, when a barrier film is formed over the glass substrate with the use of a material such as silicon nitride and the silicon oxide film 52 is formed over the barrier film, an effect of preventing entry of a mobile ion from the substrate can be obtained.

Next, an amorphous silicon film 53 is formed over the silicon oxide film 52 to a thickness of 10 nm to 200 nm, for example 50 nm. This amorphous silicon film serves as a hydrophobic surface of the present invention and becomes a polycrystalline silicon film through heat treatment performed later to be used for a TFT; therefore, the thickness thereof may be determined in accordance with the characteristics and the like of the TFT. Further, a silicon oxide film is formed over the amorphous silicon film 53 to a thickness of 10 nm to 200 nm, preferably 20 nm to 100 nm, for example 20 nm. This silicon oxide film is removed by a known photolithography method and a known etching method, so that a silicon oxide region 54 having a hydrophilic surface is formed (FIG. 5A).

Figure 5B:
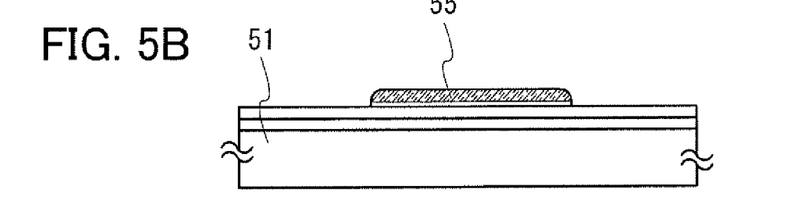

Then, a proper quantity of liquid 55 including ultrapure water is dropped onto the silicon oxide region 54 over the glass substrate 51. The quantity of the liquid may be optimized in accordance with the area of the silicon oxide region 54 or the like. Instead of ultrapure water, water to which alcohol, hydrogen fluoride, or the like is added may be used. The surface of the silicon oxide region 54 is hydrophilic, whereas the surface of the other region which is covered with the amorphous silicon film 53 is hydrophobic; therefore, the liquid stays in the silicon oxide region 54 (FIG. 5B).

In the meantime, a divided single crystal silicon wafer 56 which includes a region 57 including much hydrogen, a region 58 in the surface portion, and a silicon oxide film 59 formed thereon is prepared in a manner similar to that of Embodiment 1. Then, the divided single crystal silicon wafer 56 is set above the glass substrate 51, and dropped to the glass substrate 51 (FIG. 5C).

Figure 5C:
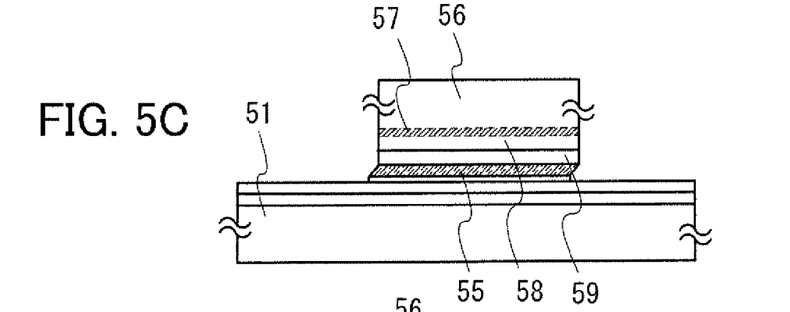
Figure 5D:
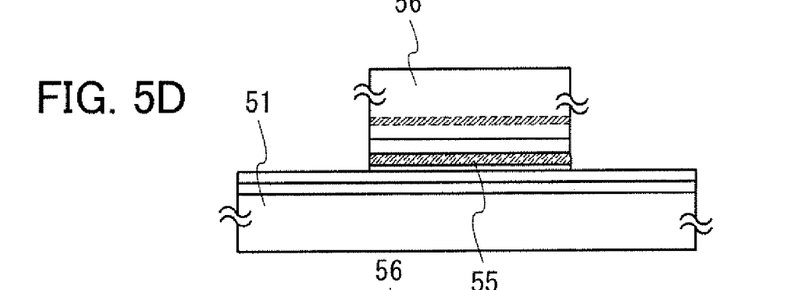

At this time, the divided single crystal silicon wafer 56 is not necessarily dropped to the silicon oxide region 54 with accuracy; even in the state of slight misalignment illustrated in FIG. 5C, the divided single crystal silicon wafer 56 is soon settled in a position that is substantially aligned with the silicon oxide region 54, owing to surface tension of the liquid 55, as illustrated in FIG. 5D (FIG. 5D).

Since the divided single crystal silicon wafer 56 needs not be provided in an opening in this embodiment, which is different from Embodiment 1, the divided single crystal silicon wafer 56 may be larger than the silicon oxide region 54. If the divided single crystal silicon wafer 56 is too large, the alignment accuracy is lowered; therefore, the size thereof is preferably 5% larger than that of the silicon oxide region 54 at most. Alternatively, the divided single crystal silicon wafer 56 may be smaller than the silicon oxide region 54, similarly to Embodiment 1.

After that, the liquid is vaporized, and the region 58 in the surface portion of the divided single crystal silicon wafer 56 is cleaved and separated through steps of pressure-bonding and heating in a manner similar to that of Embodiment 1. After the separation, heat treatment is performed at a high temperature of 600° C. or higher, for example 650° C., so that adhesion between the silicon oxide region 54 and the silicon oxide film 59 on the region 58 in the surface portion of the single crystal silicon wafer is improved. Note that the amorphous silicon film 53 is crystallized to be polycrystalline silicon by this heat treatment. Therefore, the above heat treatment step also serves to crystallize the amorphous silicon film 53. Accordingly, thermal history for a required degree of crystallinity is needed.

Although it is generally said that amorphous silicon is crystallized at approximately 600° C., crystallization progresses even at a lower temperature over time. Accordingly, even crystal with a very large grain diameter can be obtained by holding amorphous silicon at 550° C. for 24 hours to 96 hours, for example. In contrast, by rapidly raising the temperature from lower than or equal to 400° C. to higher than or equal to 700° C., crystal with a small grain diameter can be obtained. Note that in view of performing crystallization of amorphous silicon, it is preferable that a film of silicon oxide or silicon nitride be formed to cover the surface of the amorphous silicon film 53 before or after the above separation step.

In general, the mobility of a TFT using highly crystallized silicon is high; however, excessive mobility is not needed for switching of an active matrix, for example. In such a case, a silicon film processed by heat treatment at approximately 500° C. is enough. Accordingly, the heat treatment after the separation is a factor of determining even the degree of crystallinity of the amorphous silicon film 53 in addition to adhesion between the divided single crystal silicon wafer 56 and the glass substrate 51, and the condition thereof is set in accordance with requirements of a TFT or a circuit to be formed.

Figure 5E:
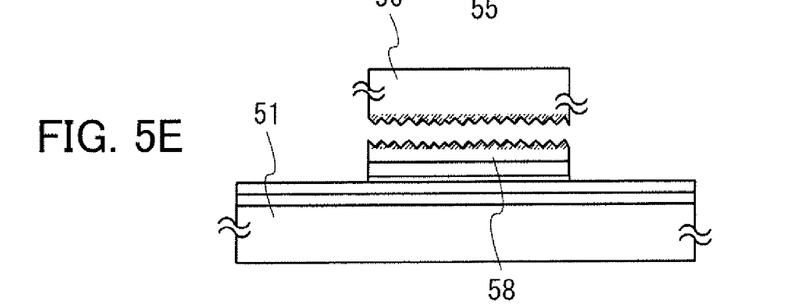
Figure 6A:
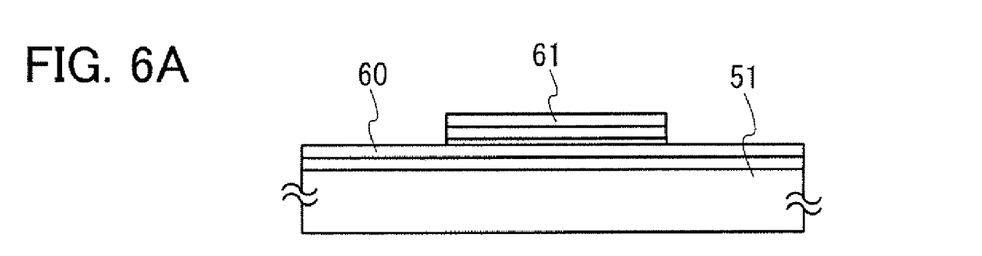
FIGS. 6A and 6B illustrate one method for manufacturing a semiconductor device, according to the present invention.
Figure 6B:
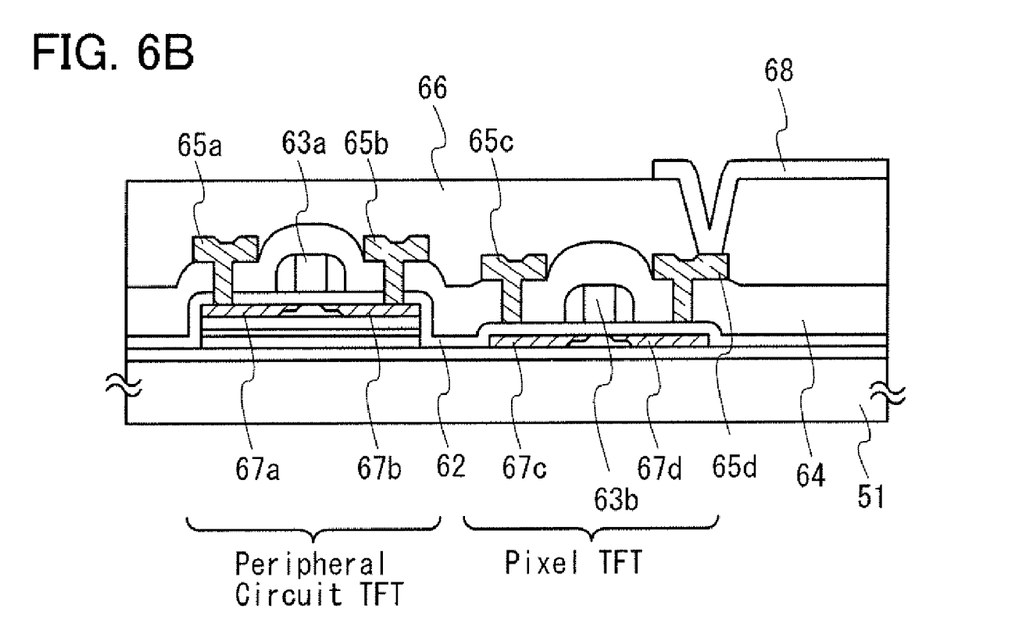

In this manner, the divided single crystal silicon wafer 56 can be separated mainly along the region 57 including much hydrogen as illustrated in FIG. 5E. After that, planarization treatment similar to that of Embodiment 1 is performed, and a semiconductor integrated circuit may be manufactured using a single crystal silicon film 61 and a polycrystalline silicon film 60 which is obtained by crystallization of the amorphous silicon film 53 as illustrated in FIG. 6A. FIG. 6B illustrates an example of such an integrated circuit.

This is an example of a display device including an active matrix circuit, in which a TFT (a pixel TFT) used for switching of a pixel in the active matrix is manufactured using the polycrystalline silicon film 60 and a TFT (a peripheral circuit TFT) used in a circuit that drives the active matrix is manufactured using the single crystal silicon film 61.

A method for manufacturing the integrated circuit is briefly described below. First, the polycrystalline silicon film 60 is selectively etched to form a region in the polycrystalline silicon TFT. Further, a silicon oxide film 62 is formed to cover the silicon oxide film 52, the single crystal silicon film 61, and the polycrystalline silicon film region over the glass substrate 51. The silicon oxide film 62 serves as a gate insulating film of the peripheral circuit TFT using the single crystal silicon film and the pixel TFT using the polycrystalline silicon film, and may be formed to a suitable thickness by a suitable method. After that, gate electrodes 63a and 63b and gate wirings of the TFTs are formed using a first conductive film. Sidewalls are formed on side surfaces of the gate electrodes 63a and 63b by a known anisotropic etching technique. Before or after the formation of the sidewalls, impurity regions 67a, 67b, 67c, and 67d of the TFTs are formed.

Then, an insulating layer 64 is formed using a material such as silicon nitride. The insulating layer 64 serves as an interlayer insulator in each of the TFTs. Further, a second wiring layer is formed using a material such as aluminum. The second wiring layer serves as source and drain electrodes 65a, 65b, 65c, and 65d of the TFTs. Furthermore, an insulating film 66 having planarity is formed, and an electrode 68 which is formed using a transparent conductive material and connected to the pixel TFT is formed. Thus, the circuit is manufactured.

Although only two TFTs are illustrated, much more TFTs are actually formed. Further, the TFTs are adjacent to each other in the figure but not necessarily arranged in such a manner. In the above example, the gate insulator, the gate electrode, the interlayer insulator, and the source and drain electrodes of the peripheral circuit TFT are formed using wirings and insulators in the same layers as those of the pixel TFT; needless to say, they may be separately formed using wirings in different layers.

Embodiment 3

Figure 7A:
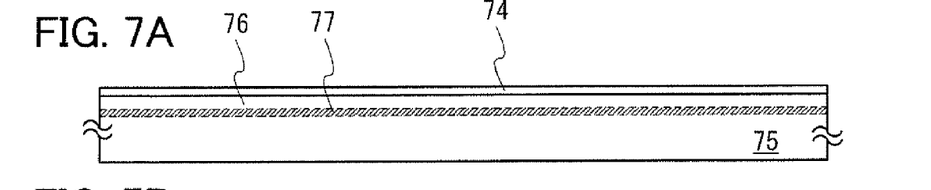
FIGS. 7A to 7E illustrate one method for manufacturing a semiconductor device, according to the present invention.

In this embodiment, an example in which a single crystal silicon integrated circuit is transferred to a glass substrate by heat treatment at a high temperature, which is used in a general VLSI process, will be described. First, in order to form a single crystal silicon film by a known hydrogen separation method, a layer 77 including much hydrogen is formed at a predetermined depth under a surface region 76 of a single crystal silicon wafer 75 (FIG. 7A).

Note that a silicon oxide film 74 is formed on the surface of the single crystal silicon wafer 75 by a thermal oxidation method to a thickness of 20 nm to 1000 nm, preferably 20 nm to 100 nm. In a general SOI device, the silicon oxide film 74 serves as a so-called buried oxide (BOX) and needs to have a certain thickness; however, in the structure of this embodiment, a conductive material is not necessarily provided under this layer as described below, and thus parasitic capacitance or the like need not be considered even when the layer is extremely thin.

Meanwhile, a barrier layer 72 formed using a single layer or a stacked layer of silicon oxide, silicon nitride, aluminum oxide, aluminum nitride, or a mixture including any of these is formed over another single crystal silicon wafer 70 to a thickness of 20 nm to 1000 nm, preferably 50 nm to 500 nm. The purpose of this layer is prevention of reaction between an element in a separation layer formed using metal, which is formed thereover, and the single crystal silicon wafer. The thickness of the barrier layer 72 is also determined depending on its material. In order to achieve the above purpose, the barrier layer 72 is preferably as thin as possible. As a method for forming the barrier layer, a thermal oxidation method, a CVD method, a sputtering method, or the like may be employed as appropriate.

A material of the barrier layer can be selected depending on a material of the separation layer formed thereover. For example, in the case of using tungsten for the separation layer, tungsten silicide can be used for the barrier layer. In this case, the barrier layer can be as thin as 20 nm to 100 nm. Similarly, in the case of using another metal material for the separation layer, silicide thereof can be used.

Further, a metal layer 73 serving as the separation layer and a silicon oxide film 71 are formed in this order over the barrier layer. The metal layer may be formed to have a metallic single-layer or multi-layer structure including a material such as tungsten, titanium, aluminum, tantalum, molybdenum, or an alloy of any of these. The thickness thereof may be set as appropriate in the range of greater than or equal to 20 nm and less than or equal to 200 nm.

The silicon oxide film 71 needs to prevent diffusion of a metal element included in the metal layer 73 serving as the separation layer; therefore, if the silicon oxide film 71 is formed using pure silicon oxide, the thickness thereof is preferably 500 nm to 1000 nm. However, in the case where a stacked-layer structure including a film of silicon oxide and a silicon nitride film, an aluminum oxide film, an aluminum nitride film, or the like is employed, the silicon oxide film 71 can be made thinner as a whole because such a material has a high barrier property. It is important that the silicon oxide film has a highly planarized surface, and the other portion may be formed using a material having a high barrier property. The stacked-layer structure including a material having a high barrier property is formed so as to be thin (100 nm to 300 nm), which is particularly effective in conducting stress to a semiconductor layer as described later.

Figures 7B, 7C:
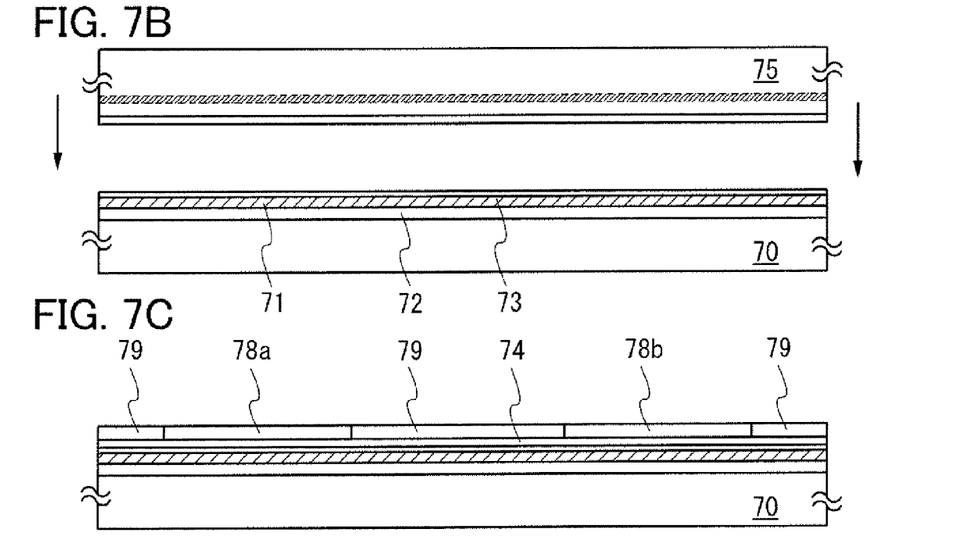

Then, the single crystal silicon wafer 75 into which hydrogen is implanted and the single crystal silicon wafer 70 over which the separation layer is formed are attached to each other as illustrated in FIG. 7B. After that, in accordance with a known hydrogen separation method, heat treatment is performed and the single crystal silicon wafer 75 is cleaved along the layer 77 including much hydrogen of the single crystal silicon wafer 75, so that the surface region 76 is left over the single crystal silicon wafer 70 with the silicon oxide film 71 and the silicon oxide film 74 interposed therebetween.

After that, heat treatment is performed at a higher temperature so that the bonding is further strengthened, and as needed, surface planarization treatment is performed; thus, a single crystal silicon film is obtained. After that, an integrated circuit may be manufactured by a known VLSI manufacturing technique. An example thereof is described below.

First, the above single crystal silicon film is selectively etched, so that island-shaped single crystal semiconductor regions 78a and 78b are formed. Further, thin silicon oxide layers are formed on side surfaces of the island-shaped single crystal semiconductor regions by a thermal oxidation method, and then a space between the island-shaped single crystal semiconductor regions is filled with an insulator 79 such as silicon oxide; thus, an element separation region is formed (FIG. 7C).

After surface planarization, a thermal oxidation film (or a thermal oxynitridation film) is formed on the surfaces of the semiconductor regions 78a and 78b to a thickness of 0.5 nm to 5 nm. In addition, a layer including a material with a high dielectric constant (e.g., hafnium oxide, lanthanum oxide, aluminum oxide, a mixture thereof, or a stack thereof) may be formed over the thermal oxidation film. These serve as a gate insulator in a TFT.

In the formation of the semiconductor circuit, since the substrate and other materials have relatively high heat resistance, a normal semiconductor wafer process can be employed without change. As a result, both high reliability and good characteristics of a semiconductor element or a semiconductor circuit can be obtained.

Next, a wiring is formed using a material such as polycrystalline silicon. This wiring serves as a gate electrode in the TFT. On a side surface of the wiring, a sidewall is formed using a known anisotropic etching technique. Before or after the formation of the sidewall, an impurity region of the TFT is formed. In order to reduce wiring resistance, a silicide may be formed over the impurity region and the gate electrode in a self-aligned manner with a known SALICIDE (Self Aligned Silicide) technology. Further, after the impurity region and the silicide are formed, a metal wiring may be formed as a gate wiring by a method such as a damascene method.

Figure 7D:
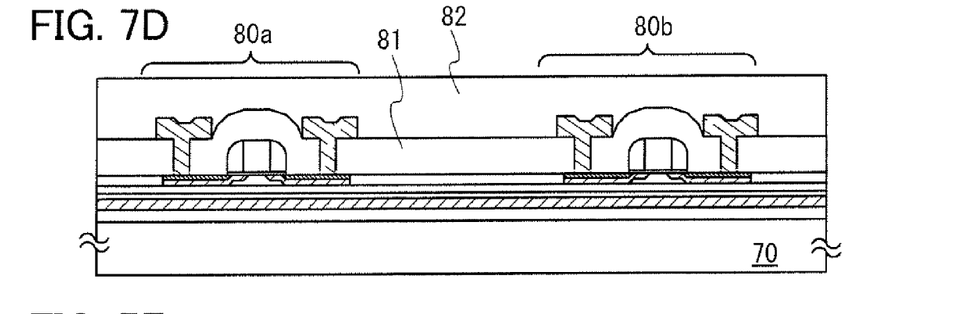

Then, an insulating layer 81 is formed using a material with large distortion therein, such as silicon nitride. The insulating layer 81 gives tensile stress or compressive stress to a channel region of the TFT and contributes to improvement in the mobility of the TFT. Such an insulating film formed from a material with large distortion therein is formed using a single film as illustrated in the figure. Further, the direction of stress (tension or compression) may be changed in accordance with the polarity of the transistor (i.e., an n-channel MOS or a p-channel MOS), and the insulating layer may be selectively provided in the periphery of the gate. Furthermore, another insulating film may be formed over the insulating layer 81 formed using a silicon nitride film.

Further, a second wiring layer is formed using a material with relatively high heat resistance, such as tungsten. The second wiring layer serves as source and drain electrodes and contact plugs of the TFT. Needless to say, this wiring layer may have a stacked-layer structure including other metal or metal nitride. For example, a three-layer structure of tungsten, titanium nitride, and titanium may be employed.

Further, a silicon oxide film 82 is formed over the second wiring layer and a surface thereof is planarized. Although silicon oxide is used here, an embodiment of the present invention is not limited to silicon oxide. A single-layer or multi-layer film including an insulator may be formed and a surface thereof may be sufficiently planarized. Here, note that the surface needs to be sufficiently planarized and hydrophilic. Therefore, after an insulating film is formed and then the surface thereof is planarized, a hydrophilic thin film of silicon oxide or the like may be further formed thereover.

Note that in order to improve adhesion in a subsequent step, 1 mol % to 20 mol % of boron or phosphorus may be added to silicon oxide. For a similar purpose, 1 mol % to 15 mol % of hydrogen may be added to silicon oxide. In this manner, the melting point of the exposed layer including silicon oxide is lowered, and the layer including silicon oxide is vitrified by heating, whereby adhesion is improved. A doping element such as boron or phosphorus changes the polarity of a semiconductor material such as silicon in some cases; however, the doping element does not cause such a problem because it is provided in a position that is sufficiently away from such a semiconductor material. In this manner, a TFT 80a in a first region and a TFT 80b in a second region are manufactured (FIG. 7D).

Figure 9A:
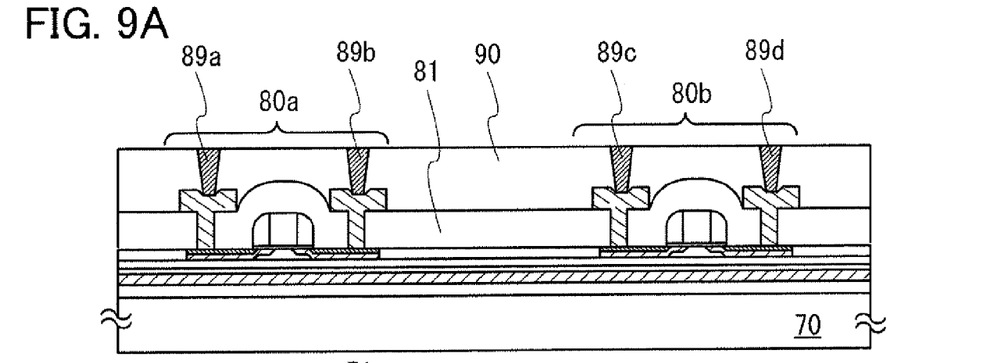
FIGS. 9A to 9D illustrate shapes of semiconductor devices manufactured in accordance with a method for manufacturing a semiconductor device according to the present invention.

Note that in the above example, the entire surface of the silicon oxide film 82 which is attached to the glass substrate is formed using silicon oxide as illustrated in FIG. 7D; however, a structure formed in such a manner that contact holes are formed in a silicon oxide layer, contact plugs 89a, 89b, 89c, and 89d are formed in the contact holes, and then planarization treatment is performed as illustrated in FIG. 9A may also be employed. In this case, in view of maintaining adhesion, the percentage of the area in the surface occupied by materials other than a hydrophilic insulator such as silicon oxide is preferably 10% or less.

Figure 7E:
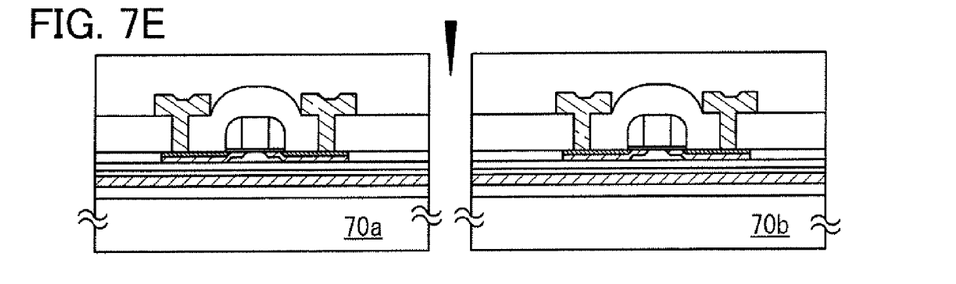

In the above manner, formation of main portions of the integrated circuit is completed. After that, the single crystal silicon wafer 70 is divided in a desired size, so that a divided single crystal silicon wafer 70a is obtained as illustrated in FIG. 7E. Hereinafter, a step of transferring the integrated circuit to a glass substrate, according to the present invention, is described.

Figure 8A:
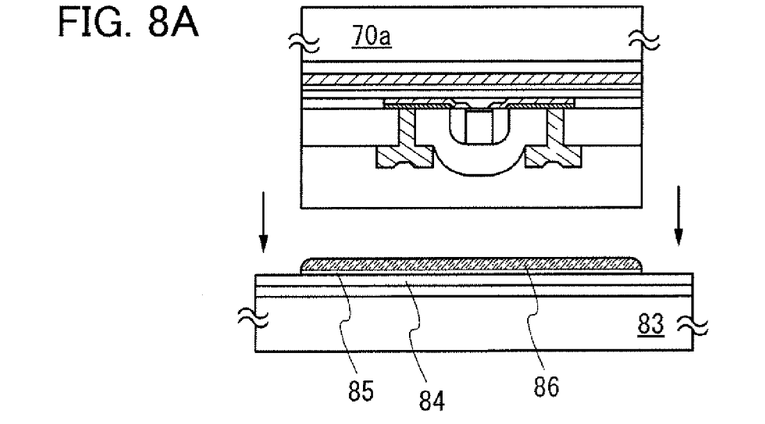
FIGS. 8A to 8D illustrate one method for manufacturing a semiconductor device, according to the present invention.

As illustrated in FIG. 8A, an amorphous silicon film 84 is formed over a glass substrate 83 to a thickness of 100 nm to 2000 nm, preferably 200 nm to 500 nm, for example 250 nm. Further, a silicon oxide film is formed thereover to a thickness of 20 nm to 200 nm, for example 50 nm. This silicon oxide film is selectively etched, so that a silicon oxide region 85 having a hydrophilic surface is formed. In a manner similar to that of the above description, 1 mol % to 20 mol % of boron or phosphorus may be added to silicon oxide so that adhesion is improved in a subsequent step. Similarly, 1 mol % to 15 mol % of hydrogen may be added to silicon oxide. If possible, the composition of a surface layer including a hydrophilic insulator on the surface of the divided single crystal silicon wafer 70a is preferably the same as the composition of the silicon oxide region 85.

Further, liquid including ultrapure water is dropped onto the silicon oxide region 85, so that a film 86 of liquid is formed. The quantity of the liquid may be optimized in accordance with the area of the silicon oxide region 85 or the like. Instead of ultrapure water, water to which alcohol, hydrogen fluoride, or the like is added may be used. The surface of the silicon oxide region 85 is hydrophilic, whereas the surface of the other region which is covered with the amorphous silicon film 84 is hydrophobic; therefore, the liquid stays in the silicon oxide region 85 (FIG. 8A).

Next, one chip of the divided single crystal silicon wafer 70a is set above the glass substrate 83 (FIG. 8A), and then dropped to the glass substrate 83. At this time, the divided single crystal silicon wafer 70a is not necessarily dropped to the silicon oxide region 85 with accuracy; even in the state of slight misalignment, the divided single crystal silicon wafer 70a is soon settled in a position that is aligned with the silicon oxide region 85, owing to surface tension of the liquid in the film 86 of the liquid, as described in the other embodiments.

Figure 8B:
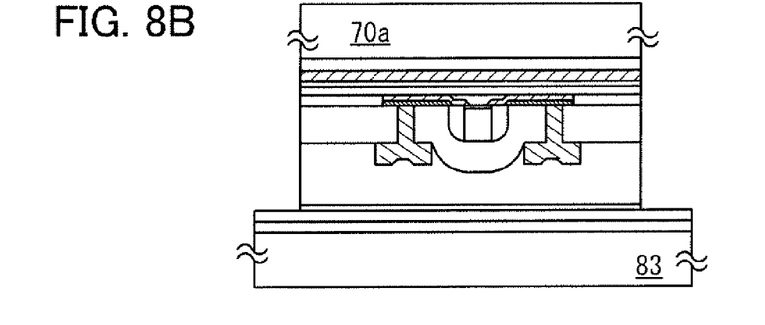

After that, the liquid is vaporized, and then pressure-bonding and heating are performed in a manner similar to those of the other embodiments. Separation is not performed at this stage in this embodiment, which is different from the other embodiments. The heating step here is performed to attach a surface of the silicon oxide region 85 over the glass substrate 83 to a surface of the silicon oxide film 82 on the single crystal silicon wafer 70a; therefore, the temperature may be raised rapidly to a needed temperature. For example, the heat treatment is performed at 650° C. to 750° C. for 2 hours to 4 hours. Needless to say, in the case where the amorphous silicon film 84 is crystallized to be used for a circuit, the temperature may be set at a temperature adequate for the purpose. Note that in the case of using silicon oxide to which phosphorus, boron, hydrogen, or the like is added in the above manner, the substrates can be attached with sufficiently high adhesion even by heating at 500° C. or lower (FIG. 8B).

Figure 8C:
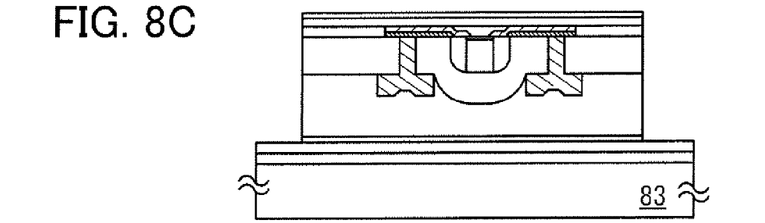

After that, along the metal layer 73 serving as a separation layer of the single crystal silicon wafer 70, a portion of the substrate, which is above the metal layer 73 in the figure, is separated. In this manner, an integrated circuit using single crystal silicon is formed over the glass substrate 83 (FIG. 8C).

Although attachment to the glass substrate is performed after the formation of the wiring and the contact plugs of the source and the drain of the integrated circuit in the above example, such a wiring may be formed after the attachment. In attachment to the glass substrate, a heating step at 500° C. or higher needs to be performed; therefore, a material with high heat resistance is necessary as a material for the contact plug or the wiring. However, such a contact plug or a wiring can be formed after the attachment of the substrates. When the contact plug or the wiring is formed after the attachment, use of a material with lower heat resistance makes no problem.

Figure 8D:
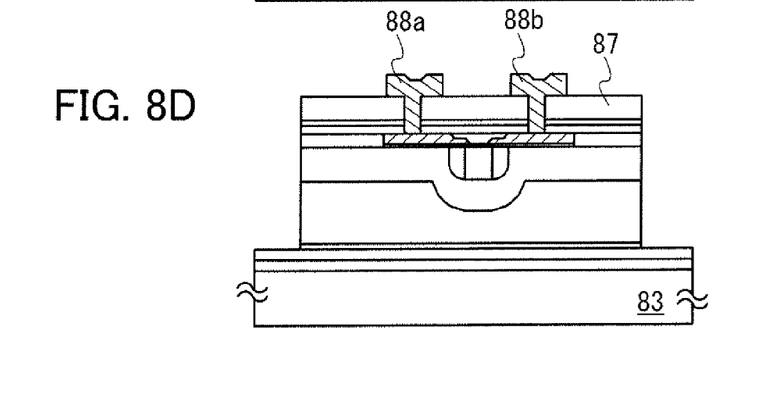

An example of that case is illustrated in FIG. 8D. In this example, after attachment and transfer of the integrated circuit to the glass substrate 83, an interlayer insulating layer 87 is formed and etched together with the silicon oxide film 71 and the silicon oxide film 74 which are a base of the integrated circuit so that contact holes are formed. Contact plugs and source and drain electrodes 88a and 88b are formed in the contact holes.

Figure 9B:
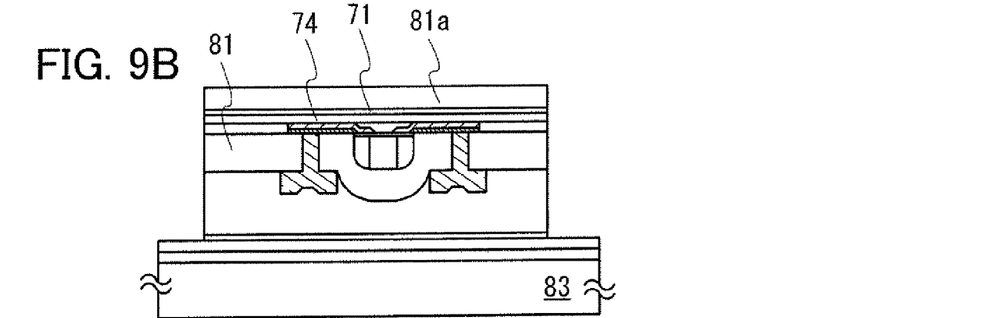

Meanwhile, in this embodiment, the island-shaped single crystal semiconductor region 78a of the TFT exists on the surface side (a side away from the substrate), which is different from a structure of a normal TFT. Therefore, an insulating layer (a stress liner) including a material with large distortion therein such as silicon nitride, which is formed to give distortion to a TFT, may be formed over the silicon oxide film 71 after the integrated circuit is transferred to the glass substrate 83, instead of forming the insulating layer to cover the gate electrode. In other words, a stress liner 81a is formed on a side opposite to the gate electrode of the TFT as illustrated in FIG. 9B.

At this time, the insulating layer 81 may be formed using a material that causes distortion or a material that does not cause distortion. However, in the case of a material that causes distortion, it preferably has a property of causing distortion opposite to that of the stress liner 81a (that is, when the stress liner 81a is a compression film, the insulating layer 81 is a tension film).

In this case, when the silicon oxide film 71 and the silicon oxide film 74 have large thicknesses, the stress is not sufficiently conducted to the island-shaped single crystal semiconductor region 78a; therefore, the silicon oxide films may be etched to adequate thicknesses. Use of a multi-layer structure including a plurality of materials for the silicon oxide film 74 instead of a single-layer structure is advantageous in the following point: by sufficiently increasing the etching selectivity, the silicon oxide film 74 can be etched to a needed thickness and made thin. Alternatively, in the case where a multi-layer structure of a material with a high barrier property and silicon oxide is employed and the thickness of the stack is sufficiently small, the stack can be directly used. The thickness of this layer is preferably 20 nm to 200 nm in consideration the above point, although the thickness depends on a material of the film.

Alternatively, when a stacked-layer film including an insulating film with high stress is originally employed, the stacked-layer film can be directly used to give distortion. In that case, it is effective that the silicon oxide film 74 is formed to have a stacked-layer structure of a silicon nitride film with a thickness of 200 nm to 1000 nm, preferably 500 nm to 1000 nm, and a silicon oxide film with a thickness of 10 nm to 100 nm thereover, instead of a single-layer structure of silicon oxide. Needless to say, the composition of the silicon nitride film may be optimized in accordance with needed stress. The thickness of the silicon nitride film may be 200 nm or less, which is enough to simply prevent diffusion of a metal element in a separation layer underlying the silicon nitride film, but is preferably more than 200 nm for giving stress.

Figure 9C:
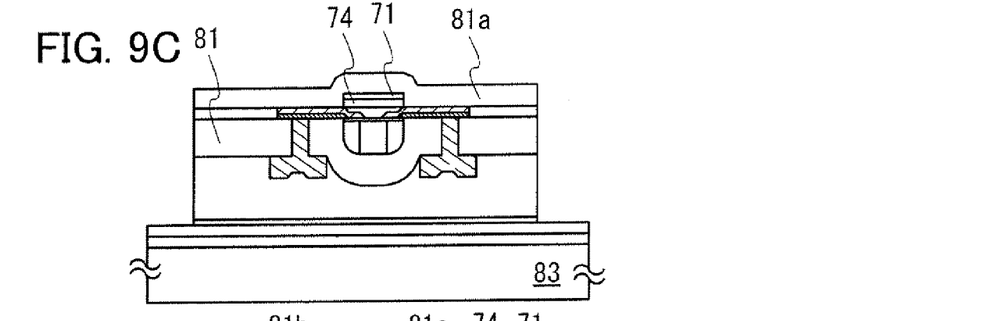

Further, part of the silicon oxide film may be removed as illustrated in FIG. 9C. In this case, it should be noted that the silicon oxide film is preferably left over the channel formation region between the impurity regions (a source region and a drain region) of the TFT. That is, a surface of the channel formation region needs to be as clean as possible in order to prevent leakage current or fluctuation in the threshold value, and thus it is preferable that the surface of the channel formation region be covered with thermal oxide thereof for that purpose.

Figure 9D:
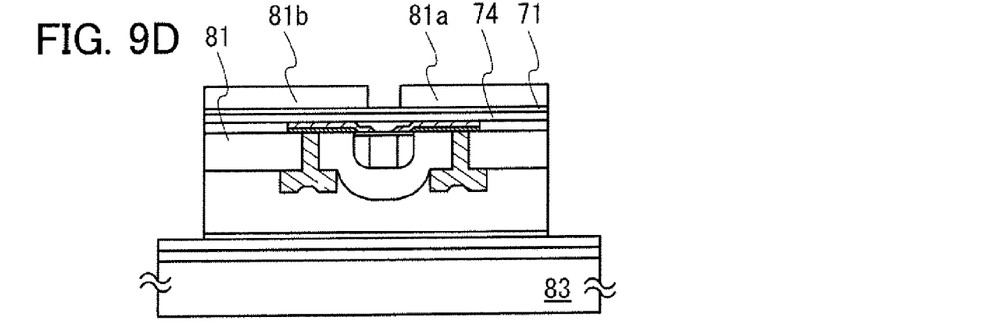

An insulating layer (the stress liner 81a) including a material with large distortion therein which is provided on the back surface of the gate electrode like the above can have the following structures: a structure like that illustrated in FIG. 9B, in which the insulating layer is provided so as to cover the island-shaped semiconductor layer, especially the channel formation region; a structure like that illustrated in FIG. 9C, in which the insulating layer is uniformly provided to cover the silicon oxide film that is selectively left over the channel formation region; and a structure like that illustrated in FIG. 9D, in which the channel formation region is sandwiched between the stress liners 81a and 81b. With the third structure, which requires high accuracy in alignment of a mask, distortion can be effectively given to the channel formation region.

In the stress liner having the structure illustrated in FIG. 9C, leverage with a fulcrum in the silicon oxide film over the channel formation region is generated. Therefore, in the case where the insulating layer 81 is formed using a material that does not generate distortion, larger distortion is generated in a portion of the channel formation region, which is closer to the gate electrode. This is just the contrary to a stress liner having a general structure (like that illustrated in FIG. 7D; that is, a stress liner formed to cover a gate electrode). With a thinner stress liner, characteristics of a TFT can be improved more effectively.

In addition to the above, a transistor having a structure in which a semiconductor layer (a channel) is sandwiched between a gate electrode and a stress liner, such as those illustrated in FIGS. 8C and 8D, and FIGS. 9B to 9D, has a feature that the stress liner is apart from an attachment surface as compared to a transistor having a conventional structure (e.g., the TFT 41 in FIG. 4D). This is effective for prevention of separation of the semiconductor layer due to distortion caused by the stress liner.

In particular, when a material having a high effect of relieving stress, such as silicon oxide or polyimide, is used for a planarization insulating film 90, a high effect is obtained because distortion from a stress liner is relieved by the planarization insulating film 90 and thus distortion hardly exist in the attachment surface (bonding surface). This means that large distortion can improve characteristics of a transistor and, in addition, that defects caused by damage to an element due to the distortion can be reduced.

This application is based on Japanese Patent Application serial no. 2009-232236 filed with Japan Patent Office on Oct. 6, 2009, the entire contents of which are hereby incorporated by reference.

What is claimed is:

1. A method for manufacturing a semiconductor device, comprising the steps of:
    irradiating a first substrate with ions to form a layer including the ions in the first substrate;
    dividing the first substrate into a plurality of second substrates;
    dropping liquid including water to form a liquid film on a hydrophilic region over a third substrate;
    putting one second substrate of the plurality of second substrates on the liquid film;
    attaching the one second substrate of the plurality of second substrates on the hydrophilic region;
    separating the one of the plurality of second substrates along the layer including the ions by heat treatment to form a semiconductor layer over the third substrate; and
    forming a circuit by using the semiconductor layer.

2. The method for manufacturing a semiconductor device, according to claim 1, wherein the liquid includes any of ethyl alcohol, methyl alcohol, isopropyl alcohol, hydrogen fluoride, hydrogen peroxide, and ammonia.

3. The method for manufacturing a semiconductor device, according to claim 1, wherein the semiconductor layer comprises single crystal silicon.

4. The method for manufacturing a semiconductor device, according to claim 1, wherein the one second substrate of the plurality of second substrates is attached on the hydrophilic region by performing pressure-bonding on the second substrate while heating the second substrate.

5. A method for manufacturing a semiconductor device, comprising the steps of:
    forming a hydrophilic region over a first substrate;
    dropping liquid including water to form a liquid film on the hydrophilic region;
    putting a second substrate on the liquid film;
    attaching the second substrate on the hydrophilic region wherein a layer including ions is formed in the second substrate;
    separating the second substrate along the layer including ions by heat treatment to form a semiconductor layer over the first substrate; and
    forming a circuit by using the semiconductor layer.

6. The method for manufacturing a semiconductor device, according to claim 5, wherein the liquid includes any of ethyl alcohol, methyl alcohol, isopropyl alcohol, hydrogen fluoride, hydrogen peroxide, and ammonia.

7. The method for manufacturing a semiconductor device, according to claim 5, wherein the semiconductor layer comprises single crystal silicon.

8. The method for manufacturing a semiconductor device, according to claim 5, wherein the second substrate is attached on the hydrophilic region by performing pressure-bonding on the second substrate while heating the second substrate.

9. A method for manufacturing a semiconductor device, comprising the steps of:
    forming a separation layer over first substrate;
    forming a semiconductor layer over the separation layer;
    forming a circuit by using the semiconductor layer;
    forming a flat hydrophilic surface over the circuit;
    forming a hydrophilic region over a second substrate;
    dropping liquid including water on the hydrophilic region to form a liquid film on the hydrophilic region;
    putting the first substrate on the liquid film;
    attaching the first substrate to the second substrate so that the flat hydrophilic surface is in contact with the hydrophilic region; and
    separating the first substrate along the separation layer so that the circuit is left over the second substrate.

10. The method for manufacturing a semiconductor device, according to claim 9, wherein the liquid includes any of ethyl alcohol, methyl alcohol, isopropyl alcohol, hydrogen fluoride, hydrogen peroxide, and ammonia.

11. The method for manufacturing a semiconductor device, according to claim 9, wherein the semiconductor layer comprises single crystal silicon.

12. The method for manufacturing a semiconductor device, according to claim 9, wherein the second substrate is attached to the second substrate by performing pressure-bonding on the second substrate while heating the second substrate.

13. A method for manufacturing a semiconductor device, comprising the steps of:

forming a hydrophilic region over a first substrate;

dropping liquid including water on the hydrophilic region to form a liquid film on the hydrophilic region;

putting a second substrate on the liquid film wherein the second substrate is provided with a separation layer, a circuit formed by using a semiconductor layer over the separation layer and a flat hydrophilic surface over the circuit;

attaching the second substrate on the hydrophilic region; and separating the second substrate along the separation layer so that the circuit is left over the first substrate.

14. The method for manufacturing a semiconductor device, according to claim 13, wherein the liquid includes any of ethyl alcohol, methyl alcohol, isopropyl alcohol, hydrogen fluoride, hydrogen peroxide, and ammonia.

15. The method for manufacturing a semiconductor device, according to claim 13, wherein the semiconductor layer comprises single crystal silicon.

16. The method for manufacturing a semiconductor device, according to claim 13, wherein the second substrate is attached on the hydrophilic region by performing pressure-bonding on the second substrate while heating the second substrate.

* * * * *